(12) United States Patent
Telecco et al.

(10) Patent No.: US 7,031,211 B1
(45) Date of Patent: Apr. 18, 2006

(54) DIRECT MEMORY ACCESS INTERFACE IN INTEGRATED CIRCUITS

(75) Inventors: Nicola Telecco, Santa Clara, CA (US); Vijaya P. Adusumilli, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 41 days.

(21) Appl. No.: 10/962,293

(22) Filed: Oct. 8, 2004

(51) Int. Cl.
*G11C 29/00* (2006.01)

(52) U.S. Cl. ............. 365/201; 365/189.02; 365/230.02
(58) Field of Classification Search .......... 365/189.05, 365/189.02, 230.02, 201
See application file for complete search history.

(56) References Cited

U.S. PATENT DOCUMENTS

| | | | | |
|---|---|---|---|---|
| 6,002,623 A | * | 12/1999 | Stave et al. ................. | 365/201 |
| 6,233,191 B1 | | 5/2001 | Gould et al. ................ | 365/221 |
| 6,864,738 B1 | * | 3/2005 | Du et al. .................... | 327/536 |

* cited by examiner

Primary Examiner—Andrew Q. Tran
(74) Attorney, Agent, or Firm—Schneck & Schneck; Thomas Schneck

(57) ABSTRACT

A direct memory access interface incorporates setting bit line selection data into a particular storage element of a desired page register element. The selection data and an access enable signal activate a memory access gate to electrically couple a memory access line with a desired memory bit line. Individual bit lines are selectable independently and more than one page register element may be selected at a time. Direct access of a memory bit line allows measurement and characterization operations to be carried out electrically with selected memory cells. This direct electrical access allows instrumentation to make voltage and current measurements necessary for characterization operations. Area that would otherwise be incorporated for an address decoder gate at each bit line selector circuit is saved since no on-chip decoding scheme is necessary. Additional area savings are realized since selection data storage are within a bidirectional storage element already present in a page register element.

11 Claims, 4 Drawing Sheets

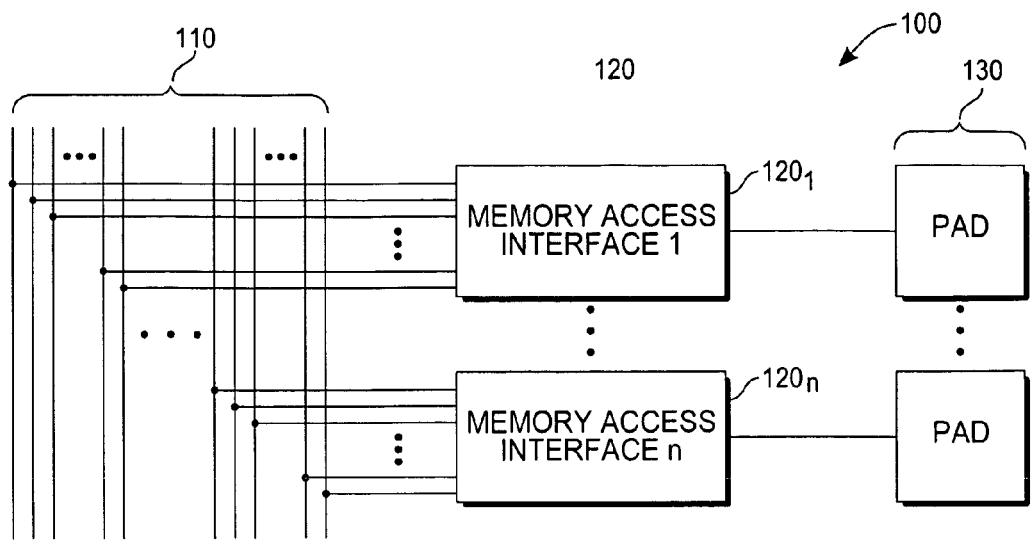
Fig._1 *(Prior Art)*
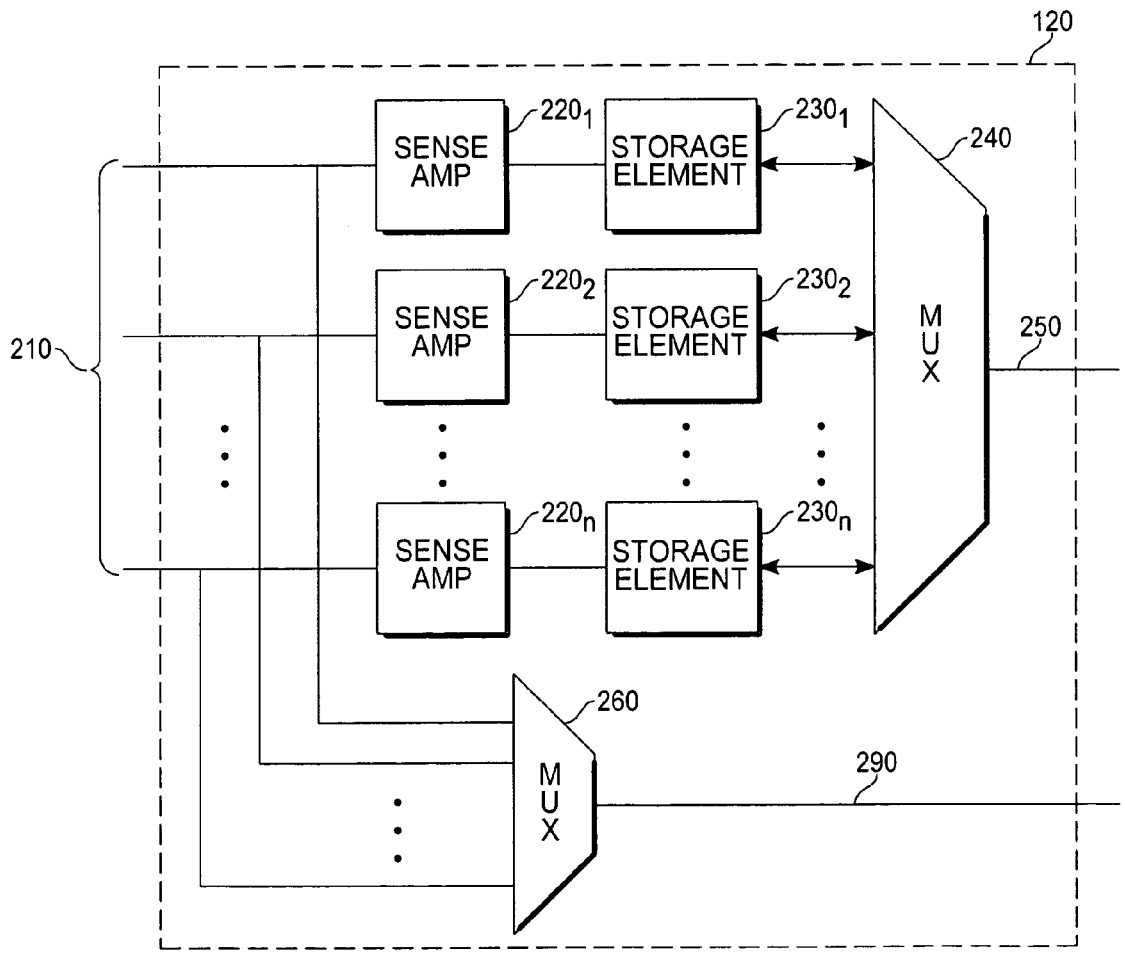
Fig._2 *(Prior Art)*

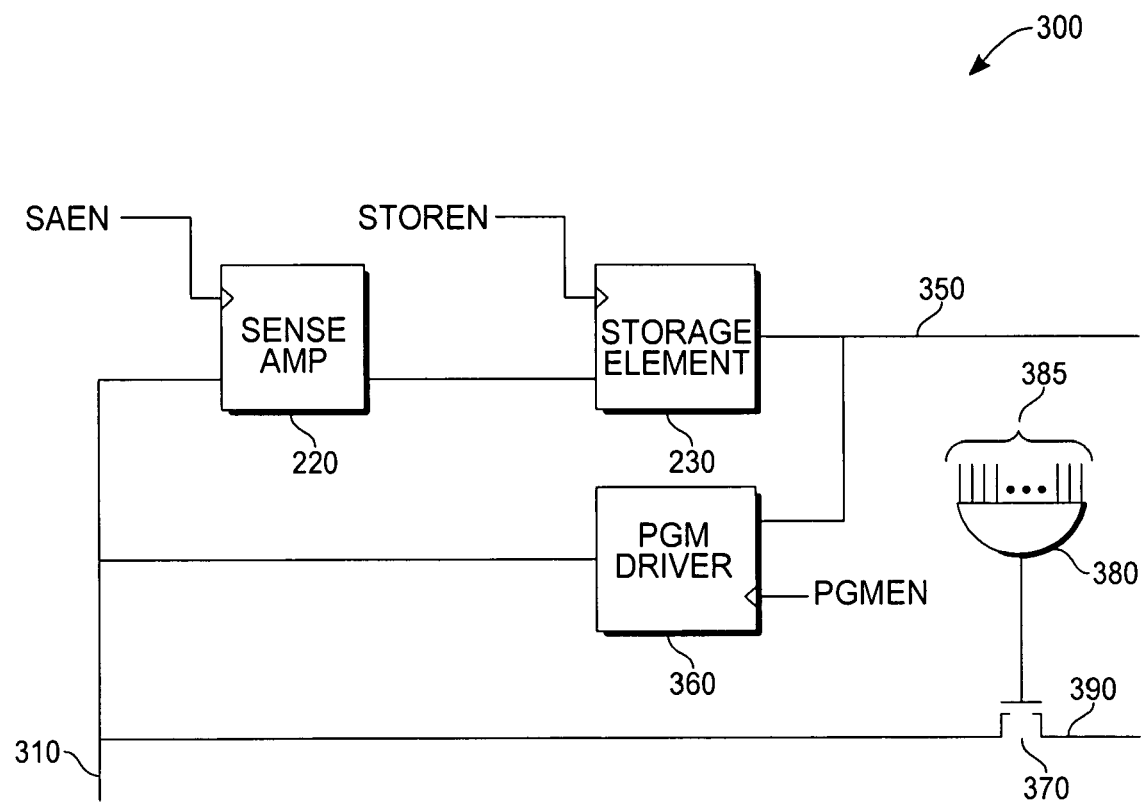
Fig._3 (Prior Art)

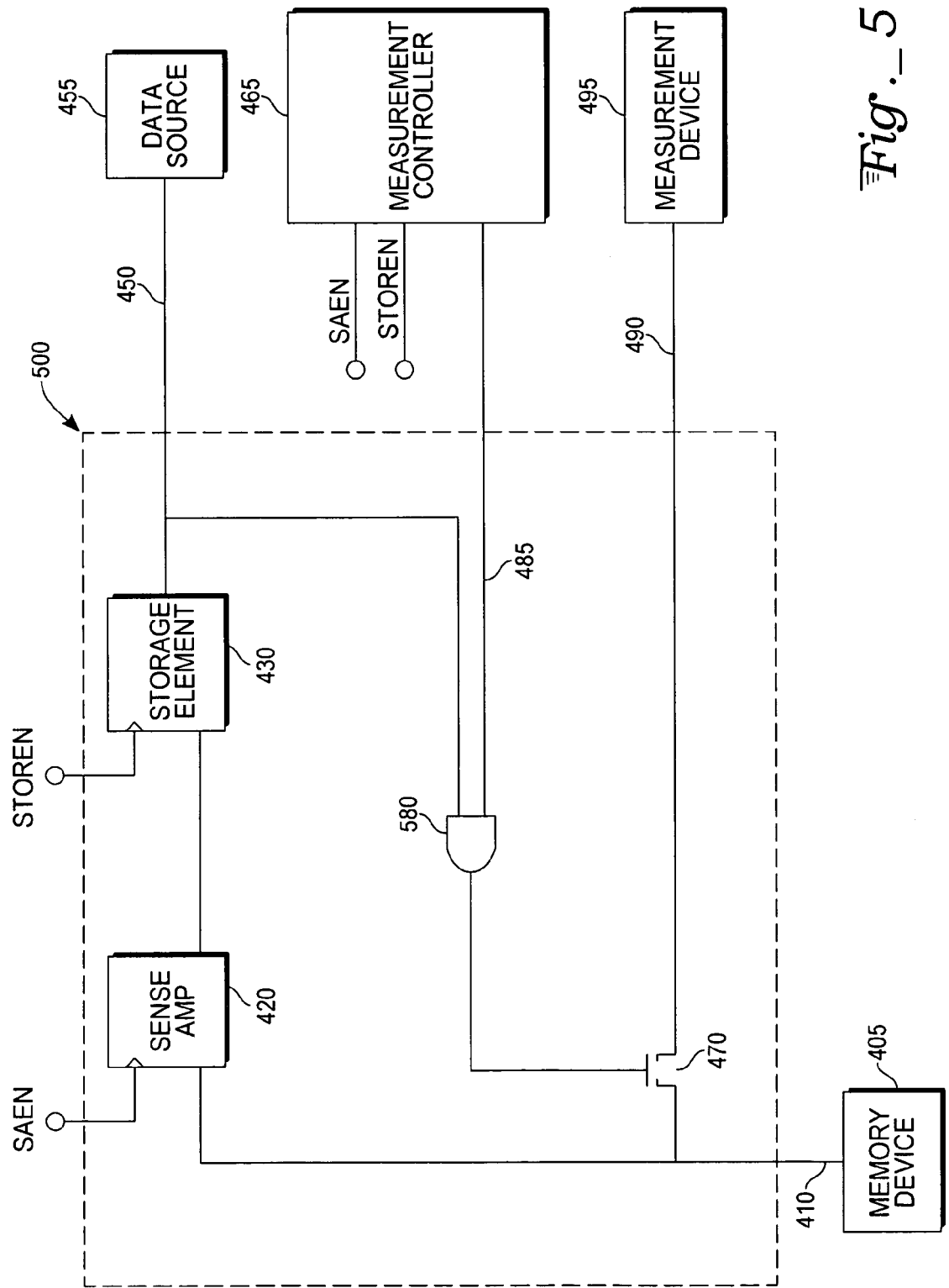
Fig._5

# DIRECT MEMORY ACCESS INTERFACE IN INTEGRATED CIRCUITS

TECHNICAL FIELD

The invention relates to direct memory bit line access interfaces used to establish a direct electrical connection to an internal memory cell of an integrated circuit.

BACKGROUND ART

A direct memory bit line access interface is important for testing and characterizing memory devices within integrated circuits. This interface allows execution of measurement operations by providing access to selected memory bit lines. The interface provides access for externally connected instrumentation to have a direct electrical connection to memory cells allowing measurement and characterization operations to be carried out. Critical measurements executable by direct electrical connection are bit line leakage measurements, bit line capacitance characterization, bit line to bit line short detection, memory cell current/voltage characterization, and memory cell operation with external voltage levels.

With reference to FIG. 1, a direct memory bit line access interface 100 provides connection to a particular set of bit lines within a large array of memory bit lines 110 within an internal memory of an integrated circuit. A memory access interface register $120_1 \ldots 120_n$ selects a particular set of bit lines, senses the bit line data values, and retains a plurality of values read. The direct memory bit line access interface 100 also manages connection of a retained bit line value to one of several data pads 130 of the integrated circuit. The direct memory bit line access interface 100 also provides programming capabilities for the memory cells connected to by the memory bit lines 110.

With reference to FIG. 2, a particular set of memory bit lines 210 associated with a memory access register element 120, connect to the respective inputs of a register of sense amps $220_1 \ldots 220_n$ (i.e., sense amplifiers). Outputs of the sense amps $220_1 \ldots 220_n$ connect to a register of bidirectional storage element $230_1 \ldots 230_n$. The bidirectional storage element $230_1 \ldots 230_n$ connect to a bidirectional data multiplexer 240. The bidirectional data multiplexer 240 has an output bidirectional data line 250 connected to a data pad (not shown). The memory bit lines 210 also connect to the inputs of a memory bit line multiplexer 260. The memory bit line multiplexer 260 has an output memory access line 290 connected to a data pad (not shown).

With reference to FIG. 3, a memory bit line 310 of a page register element 300 connects to an input of a sense amp 220. An output of the sense amp 220 connects to a bidirectional storage element 230. The bidirectional storage element 230 also connects to a bidirectional data line 350 and a programming driver 360. An output of the programming driver 360 connects to the memory bit line 310. The memory bit line 310 is connected to a memory access line 390 through a memory access gate 370. The memory access gate is enabled by a connection to a select signal at the output of an address select gate 380. The address select gate 380 is activated with an application of address bits at address bit lines 385 that correspond to an address of the page register element 300 or address of a memory bit line.

The memory access interface register $120_1 \ldots 120_n$ (FIG. 1) includes several memory access register elements 120 (FIG. 2), each of which comprises a page register element 300 (FIG. 3) for each memory bit line 310 to which it is connected. The bidirectional data line 350 and the memory access line 390 connect to the bidirectional data multiplexer 240 and the memory bit line multiplexer 260 respectively.

Typically, a memory access gate is activated by connection to an address decoder gate within a memory bit line selection scheme. The address decoder is repeated for each page register element. An address decoder gate may become large and complex depending upon the number of address selection bits required in the selection scheme. The size of each address decoder gate and an instantiation of one decoder gate per bit line selected requires die area. Unless an address decoder scheme becomes additionally complex, only one address and, therefore, only one bit line, is selectable at a time. It is desirable to be able to have access to bit lines and avoid having additional logic incorporating a substantial amount of silicon area at each bit line instance. It is further desirable to be able to select multiple page register elements simultaneously and independently.

DISCLOSURE OF INVENTION

A direct memory access interface incorporates setting bit line selection data into a storage element of a particular page register element. The selection data and an access enable signal activate a memory access gate to electrically couple a memory access line with a desired memory bit line. Individual bit lines are selectable independently and more than one page register element may be selected at a time. Direct access of a memory bit line allows measurement and characterization operations to be carried out electrically with selected memory cells. This direct electrical access allows instrumentation to make voltage and current measurements necessary for characterization operations. Area that would otherwise be incorporated for an address decoder gate at each bit line selector circuit is saved since no on-chip decoding scheme is necessary. Additional area savings are realized since selection data are stored within a bidirectional storage element already present in a page register element.

BRIEF DESCRIPTION OF DRAWINGS

FIG. 1 is a block diagram of a prior art direct memory bit line access interface.

FIG. 2 is a block diagram of a prior art memory access register of the direct memory bit line access interface of FIG. 1.

FIG. 3 is a block diagram of a prior art memory page register element of the memory access register of FIG. 2.

FIG. 5 is a block diagram of an alternate exemplary embodiment of a memory page register element of the present invention.

MODES FOR CARRYING OUT THE INVENTION

Figure 4:
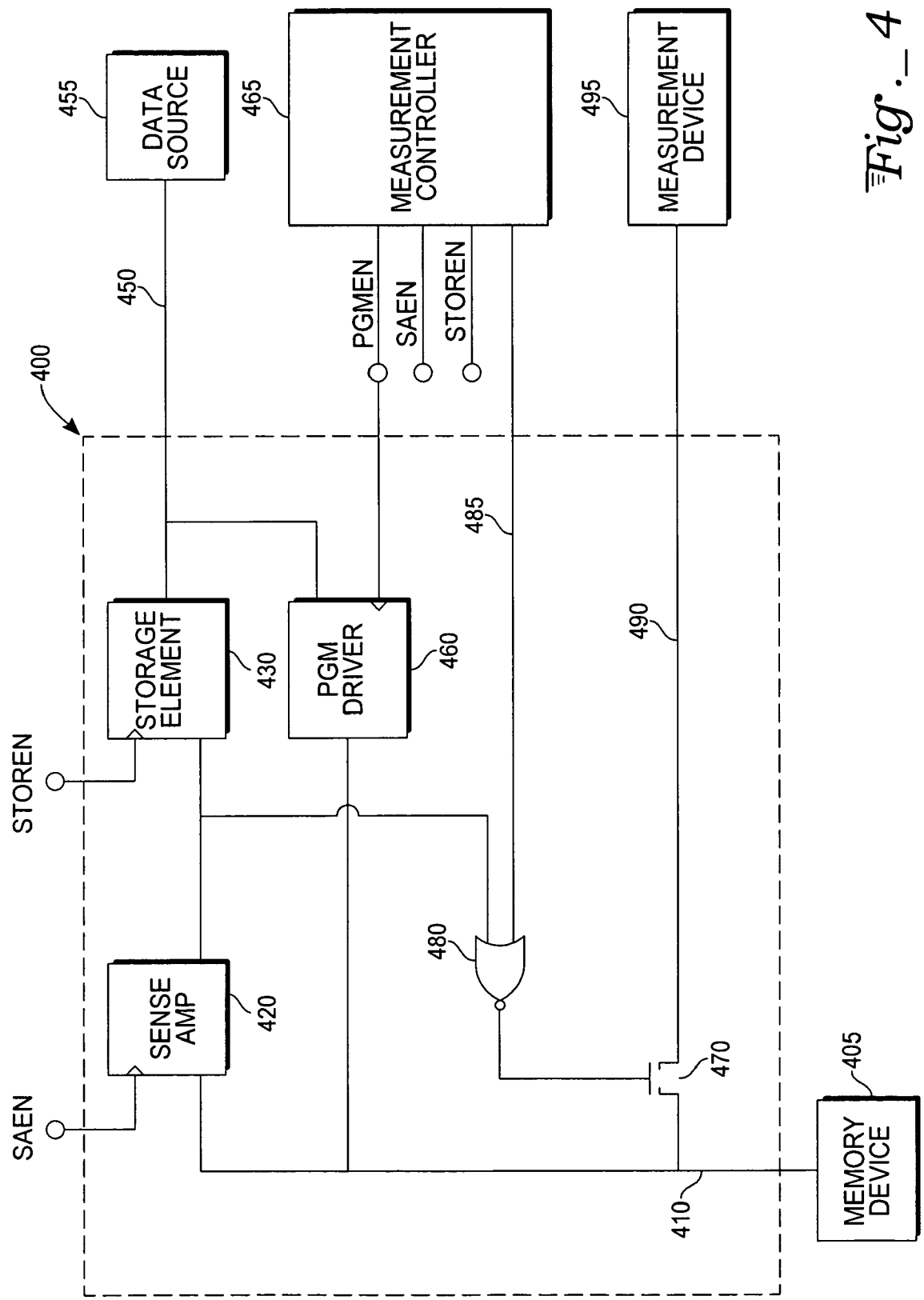
FIG. 4 is a block diagram of an exemplary embodiment of a memory page register element of the present invention.

With reference to FIG. 4, a memory bit line 410 of an exemplary page register element 400 connects from a memory device 405 to an input of a sense amp 420. An output of the sense amp 420 connects to a bidirectional storage element 430 and a memory access select gate 480. The bidirectional storage element 430 also connects to a bidirectional data line 450 and an optional programming driver 460. A measurement controller 465 connects to a sense amp enable node (SAEN) of the sense amp 420, a programming enable node (PGMEN) of the programming driver 460, and a store enable node (STOREN) of the bidirectional storage element 430. An output of the programming driver 460, if employed, connects to the memory bit line 410. A data source 455 connects to the bidirectional data line 450 for providing data to either the bidirectional storage element 430 or the programming driver 460. The memory bit line 410 is connected to a memory access line 490 through a memory access gate 470. The memory access line 490 connects to a measurement device 495 for applying and measuring electrical levels from a memory cell within memory device 405. The memory access gate 470 is activated by a select signal from a select output of the memory access select gate 480.

In one example, to perform a cell current measurement, a memory access enable input of the memory access select gate 480 is connected to the measurement controller 465 through a memory access enable line 485. A selection input of the memory access select gate 480 is connected to an output of the bi-directional storage element 430. The memory access select gate 480 receives an output logic level determined by selection data retained in the bi-directional storage element 430. The measurement controller 465 connects to all bit lines of the memory device 405 through multiple page register elements (not shown). Communication and control is established by the measurement controller 465 using multiple parallel signals such as SAEN, PGMEN, STOREN, a memory access enable line to each page register element used, and various address selection lines connected to the memory device 405 (not shown).

To select a memory bit line 410 of interest, a selection data signal is applied at a low logic level from the data source 455 through the corresponding bidirectional data line 450. This is also true for each of a plurality of bit lines (not shown) to be accessed at a single time. The measurement controller 465 may apply enabling signals to all page registers of an integrated circuit (not shown). All page registers of an integrated circuit may be connected in parallel to the measurement controller 465 and the measurement device 495. Particular memory cells are selected in parallel by the measurement controller 465 applying selection signals to the word lines of interest in the memory device 405 (not shown). The measurement controller 465 enables the selection data to be stored from the data source 455, through the bidirectional data line 450, and into the bidirectional storage element 430. Storage is initiated with a store enable signal applied to the store enable node from the measurement controller 465 through the memory access enable line 485.

Selection data of a low logic level is fed from an output of the bidirectional storage element 430 to the selection input of the memory access select gate 480. The select gate 480 activates the memory access gate 470 by receiving a low logic level as an access enable signal from the measurement controller 465. By this selection means, selection data from the data source 455 and the access enable signal from the measurement controller 465 replace address decode logic that would otherwise be required at each page register element 400.

The activated memory access gate 470 electrically couples the memory access line 490 with the memory bit line 410. This electrical coupling allows a measurement device 495 attached to the memory access line 490 to read or apply electrical signals and voltage levels to write, measure, or characterize a corresponding selected memory cell. The measurement device 495 may be located externally or internally to the integrated circuit. Additionally, with selection data stored in the bidirectional storage element 430, the bidirectional data line 450 is left free to operate the programming driver 460, providing a capability of monitoring or testing programming operations through the memory access line 490.

In an alternate exemplary embodiment of a page register element 500 of FIG. 5, selection of a particular memory bit line 410 of the memory device 405 is accomplished by a selection data signal being applied at a high logic level from the data source 455 through the corresponding bidirectional data line 450. The selection data signal is connected to the selection input of the memory access select gate 580. The measurement controller 465 produces a high logic level access enable signal, which is connected to the memory access enable input of the memory access select gate 580 through a memory access enable line 485. The memory access select gate 580 performs a logical AND function and produces a high logic level access selection signal at the select output. A high logic level signal applied to the memory access gate 470 produces an electrical connection between the measurement device 495 and the selected memory bit line 410 through the memory access line 490.

Although a direct memory access interface has been shown in terms of a memory access select gate being implemented as a NOR gate or an AND gate, an artisan would recognize that a NAND or an OR gate could also be used for the same access selection control. While a memory access gate has been shown as an NMOS transistor with a series connected channel, a practitioner in the art would readily recognize that the same switching means may be implemented by alternatives such as a transmission gate or a PMOS transistor. While memory device means, data sources, and measurement control devices have been shown as managing the supplying and measurement of electrical levels, one skilled in the art would readily realize that various other equipment such as test generators, logic analyzers, voltage sources, signal generators, electrical meters, and controllers may be utilized to achieve similar results. A skilled practitioner would also recognize that a storage element may be implemented in many embodiments such as a latch, a flip-flop, or cross-coupled inverters.

What is claimed is:

1. A direct memory access circuit comprising:
a memory bit line;
a memory access line;
a bidirectional data line capable of receiving selection data; and
a selection circuit comprising:
a storage element coupled to said bidirectional data line;
a memory access gate coupled to said memory bit line and said memory access line; and
a memory access select gate having a selection input, a memory access enable input, and a select output, said select output coupled to said memory access gate, said selection input coupled to said storage element, and said memory access enable input configured to receive an access enable signal.

2. The direct memory access circuit of claim 1, wherein said memory access gate is configured to electrically couple said memory access line with said memory bit line upon application of said selection data and said access enable signal to said memory access select gate.

3. A direct memory access system comprising:
a memory device containing one or more memory cells;
at least one memory bit line in electrical communication with at least one of said memory cells;
a measurement device;
a data source capable of producing selection data;

a measurement control device configured to produce an access enable signal; and at least one register element electrically coupled to said at least one memory bit line, said at least one register element each comprising:

a memory access gate coupled to said memory bit line, a memory access line coupled to said memory access gate and said measurement device, a bidirectional data line coupled to said data source, a storage element coupled to said bidirectional data line and said measurement control device, and a memory access select gate coupled to said memory access gate, said storage element, and said measurement control device.

4. The direct memory access system of claim 3, wherein said memory access gate is configured to electrically couple said memory access line with said memory bit line upon application of said selection data and said access enable signal to said memory access select gate.

5. The direct memory access system of claim 3, wherein said controlled direct memory bit line access allows for testing and characterizing operations by electrical measurement.

6. A method for controlling direct memory access, the method comprising:

selecting a memory cell in a memory array;

writing a selection bit to a storage element, said storage element associated with said selected memory cell;

generating a select signal from said storage element containing said selection bit;

receiving said select signal at a selection gate to allow access to said selected memory cell, said access providing electrical communication with said memory cell; and coupling said selected memory cell to an access line, said access line allowing electrical equipment to be coupled to said selected memory cell allowing characterizing of said memory cell.

7. The method for controlling direct memory access of claim 6, wherein said selecting step includes selecting a plurality of memory cells.

8. The method for controlling direct memory access of claim 6, wherein said characterizing further comprises performing leakage measurements on said selected memory cell.

9. The method for controlling direct memory access of claim 6, wherein said characterizing further comprises performing bitline capacitance characterization and bitline-to-bitline short detection.

10. The method for controlling direct memory access of claim 6, wherein said characterizing further comprises stimulating and measuring current and voltage, thereby characterizing said selected memory cell.

11. The method for controlling direct memory access of claim 6, wherein said characterizing further comprises programming said memory cell with external voltages.

* * * * *